(12) United States Patent
Kim et al.

(10) Patent No.: US 8,878,774 B2
(45) Date of Patent: Nov. 4, 2014

(54) ELECTRONIC APPARATUS FOR PROXIMITY SENSING

(75) Inventors: Bo-min Kim, Seoul (KR); Sang-ok Cha, Daegu (KR); Hyun-jin Kim, Seoul (KR); Han-chul Jung, Seoul (KR)

(73) Assignee: Samsung Electronics Co., Ltd (KR)

( * ) Notice: Subject to any disclaimer, the term of this patent is extended or adjusted under 35 U.S.C. 154(b) by 423 days.

(21) Appl. No.: 12/914,558

(22) Filed: Oct. 28, 2010

(65) Prior Publication Data

US 2011/0102378 A1 May 5, 2011

(30) Foreign Application Priority Data

Oct. 30, 2009 (KR) ........................ 10-2009-0104294

(51) Int. Cl.
```
G09G 5/00      (2006.01)
G06F 3/0485    (2013.01)
G06F 3/042     (2006.01)
G06F 3/01      (2006.01)
H03K 17/94     (2006.01)
```

(52) U.S. Cl.
CPC ............ *H03K 17/943* (2013.01); *G06F 3/0485* (2013.01); *G06F 2203/04101* (2013.01); *G06F 3/042* (2013.01); *G06F 3/017* (2013.01)

USPC .......................................... 345/156; 715/863

(58) Field of Classification Search
CPC ........................... G06F 3/0308; G06F 3/0325
USPC .................................. 345/156–184; 715/863
See application file for complete search history.

(56) References Cited

U.S. PATENT DOCUMENTS

```
7,138,809   B2    11/2006   Nakamura et al.
2005/0264304 A1   12/2005   Nakamura et al.
2008/0034331 A1*  2/2008    Josephsoon et al. ........ 715/863
2008/0284738 A1   11/2008   Hovden et al.
2009/0159900 A1   6/2009    Basoor et al.
2010/0294938 A1*  11/2010   Alameh et al. ............... 250/342
2012/0092254 A1*  4/2012    Wong et al. .................. 345/158
```

FOREIGN PATENT DOCUMENTS

```
CN    200510069223      11/2005
EP         1 593 988     11/2005
JP       2007-052928      3/2007
```

* cited by examiner

*Primary Examiner* — Michael Pervan
(74) *Attorney, Agent, or Firm* — The Farrell Law Firm, P.C.

(57) ABSTRACT

An electronic apparatus controls to sense a particular direction motion in directions detectable by a proximity sensor, which senses proximity and motion directions of a subject. Thus, a user can utilize the proximity sensor with decreased recognition error and a high recognition rate as a user interface of the electronic apparatus.

20 Claims, 19 Drawing Sheets

ELECTRONIC APPARATUS FOR PROXIMITY SENSING

PRIORITY

This application claims priority to Korean Patent Application No. 2009-0104294, which was filed on Oct. 30, 2009 in the Korean Intellectual Property Office, the contents of which are incorporated herein by reference.

BACKGROUND OF THE INVENTION

1. Field of the Invention

The present invention relates generally to an electronic apparatus, and more particularly, to an electronic apparatus for sensing proximity and motion of a subject through a proximity sensor.

2. Description of the Related Art

Recent advances in multimedia device technology have allowed a single device to offer various functions. For example, it is common for a single mobile device to offer a portable phone function, a Motion Pictures Experts Group (MPEG) Layer Audio 3 (MP3) player function, and a Digital Multimedia Broadcasting (DMB) function.

With the ever-increasing amount of functions, command input by a user has become more complicated. Accordingly, simplified techniques for providing a user interface are evolving. An example is a recent development of the sensor technology integration with mobile devices, which offers the user interface employing a variety of sensors.

That is, electronic devices now offer the user interface by sensing nearness of a user's hand to the proximity sensor and a proximity gesture of the user through the proximity sensor.

However, the proximity sensor tends to inaccurately recognize the user's gesture. Naturally, when the proximity sensor is used, a user requires correct recognition of the intended command.

Accordingly, there is a need in the art for a method for increasing the recognition accuracy of the proximity sensor for the user's proximity gesture.

SUMMARY OF THE INVENTION

The present invention has been provided to address the above-mentioned and other problems and disadvantages occurring in the prior art, and an aspect of the present disclosure provides an electronic apparatus for controlling a proximity sensor which detects proximity and motion directions of a subject, to sense a particular direction motion among detectable movement directions. According to an aspect of the present invention, an electronic apparatus includes a proximity sensor for sensing proximity and a motion direction of a subject, and a control unit for controlling to sense a particular direction motion of directions detectable by the proximity sensor.

BRIEF DESCRIPTION OF THE DRAWINGS

The above and/or other aspects of the present invention will become more apparent from the following description of embodiments thereof, with reference to the accompanying drawings, in which.

DETAILED DESCRIPTION OF EMBODIMENTS OF THE PRESENT INVENTION

Figure 1:
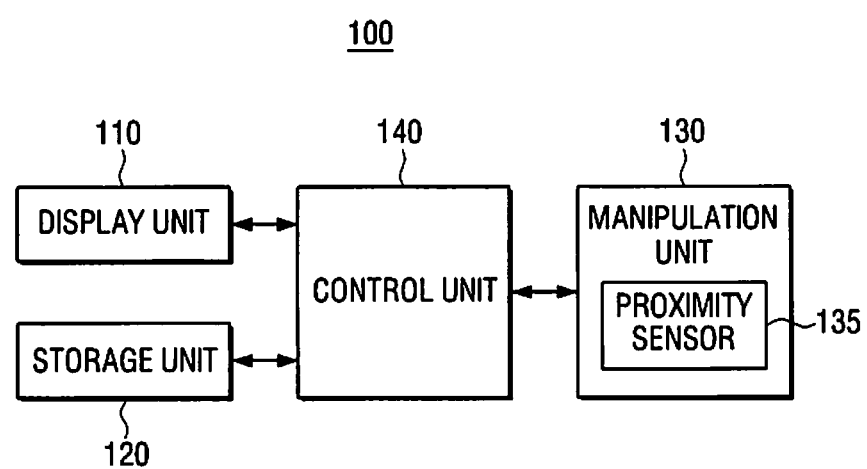
FIG. 1 illustrates a block diagram of an electronic apparatus according to an embodiment of the invention.

Embodiments of the present invention will now be described in greater detail with reference to the accompanying drawings.

In the following description, the same drawing reference numerals are used to refer to the same elements, even in different drawings. The matters defined in the following description, such as detailed construction and element descriptions, are provided as examples to assist in a comprehensive understanding of the invention. Also, well-known functions or constructions are not described in detail for the sake of clarity and conciseness.

FIG. 1 illustrates a block diagram of an electronic apparatus 100 according to an embodiment of the invention. The electronic apparatus 100 of FIG. 1 includes a display unit 110, a storage unit 120, a manipulation unit 130, and a control unit 140.

The display unit 110 displays an image for providing functions of the electronic apparatus 100, an image of an application being executed, in a screen, and Graphic User Interfaces (GUIs) for a user's manipulation in the screen.

The storage unit 120 stores an application program as well as programs for executing the various functions of the electronic apparatus 100. The storage unit 120 is implemented, for example, using a hard disk and/or a non-volatile memory.

The manipulation unit 130 receives a user's various manipulations and sends the input user manipulation information to the control unit 140. The manipulation unit 130 includes a variety of user interface devices, such as a proximity sensor 135 as shown in FIG. 1.

The proximity sensor 135 senses proximity and motion direction of a subject. Herein, the subject is a user's hand or other appendage, but the proximity sensor 135 may also sense other objects.

The motion direction of the subject indicates a direction of a gesture when the user's hand or other body part is close to the proximity sensor 135. For example, the motion direction of the subject can be the motion direction of the user's hand in the proximity of the proximity sensor 135.

The proximity sensor 135 includes at least one light emitter for flickering according to a preset loop, and a photodetector for detecting the light emitted and reflected from the at least one light emitter. The proximity sensor 135 sends the information detected by the photodetector to the control unit 140.

The proximity sensor 135 includes at least one light emitter. When the proximity sensor 135 includes one light emitter, it can only detect proximity. When the proximity sensor 135 includes two or more light emitters, it can detect the motion and proximity coordinates of the subject. As the number of the light emitters increases, the preciseness of motion detection of the proximity sensor 135 increases.

More specifically, based on the photodetector, the proximity sensor 135 may include a first light emitter disposed on the top end, a second light emitter disposed on the left side, a third light emitter disposed on the bottom end, and a fourth light emitter disposed on the right side of the sensor 135. The proximity sensor 135 may sense the y-axis motion direction formed by the first light emitter and the third light emitter, and the x-axis motion direction formed by the second light emitter and the fourth light emitter. The structure and the functions of the proximity sensor 135 will be explained in detail in the below description of FIG. 2.

The control unit 140 controls operations of the electronic apparatus 100 according to the user's manipulation input through the manipulation unit 130. In detail, the control unit 140 controls to sense a particular direction motion among the movement directions detectable by the proximity sensor 135. That is, the control unit 140 may control the proximity sensor 135 to sense only the vertical motion or the horizontal motion of the subject.

Depending on the current function, the control unit 140 may define the particular direction. For instance, when a list with the vertical scrolling is displayed in the screen of the electronic apparatus 100, the control unit 140 controls the proximity sensor 135 to sense only the vertical motion of the subject. When a list with the horizontal scrolling is displayed in the screen of the electronic apparatus 100, the control unit 140 controls the proximity sensor 135 to sense only the horizontal motion of the subject.

Depending on a user's selection, the control unit 140 may define the particular direction. For instance, when the user sets to sense only the vertical proximity gesture, the control unit 140 controls the proximity sensor 135 to sense only the vertical motion of the subject. When the user sets to sense only the horizontal proximity gesture, the control unit 140 controls the proximity sensor 135 to sense only the horizontal motion of the subject.

By controlling to switch on and off only at least one light emitter of the proximity sensor 135, the control unit 140 controls the proximity sensor 135 to sense the particular direction motion in the detectable movement directions.

More specifically, the control unit 140 switches on and off the target light emitters according to a preset loop, which indicates the flickering order of the light emitters.

For example, the proximity sensor 135 includes, based on the photodetector, the first light emitter disposed on the top end, the second light emitter disposed on the left side, the third light emitter disposed on the bottom end, and the fourth light emitter disposed on the left side of the sensor 135, which will now be explained.

The preset loop is assumed to be the order of the first light emitter, the second light emitter, the third light emitter, and the fourth light emitter. To sense the vertical motion, the light emitters to flicker are the first light emitter and the third light emitter. The control unit 140 defines the process of switching on and off the first light emitter once and then the third light emitter once as one loop, and controls the proximity sensor 135 to repeatedly switch on and off the first light emitter and the third light emitter according to the defined loop. When the photodetector detects the light at the flickering of the first light emitter, the control unit 140 determines that the subject is located above the proximity sensor 135. When the photodetector detects the light at the flickering of the third light emitter, the control unit 140 determines that the subject is located below the proximity sensor 135. As such, the control unit 140 controls the proximity sensor 135 to detect the vertical movement of the subject.

When the proximity sensor 135 recognizes the proximity of the subject, the control unit 140 controls to accelerate the repetition speed of the preset loop faster than the non-recognition of the subject. That is, when the proximity of the subject is not recognized, the control unit 140 controls to retard the repetition speed of the preset loop of the proximity sensor 135. Upon recognizing the proximity of the subject, the control unit 140 controls to quicken the repetition speed of the preset loop of the proximity sensor 135. By regulating the repetition speed of the loop, the control unit 140 decreases unnecessary loop repetitions of the proximity sensor 135 and thus reduces power consumption.

As above, by sensing only the particular direction motion in the movement directions detectable by the proximity sensor 135, the electronic apparatus 100 can prevent error caused when the motion of the unnecessary direction is detected. Since the proximity sensor 135 senses only the currently necessary direction motion, the electronic apparatus 100 can sense the particular direction motion without error by means of the proximity sensor 135.

Figure 2:
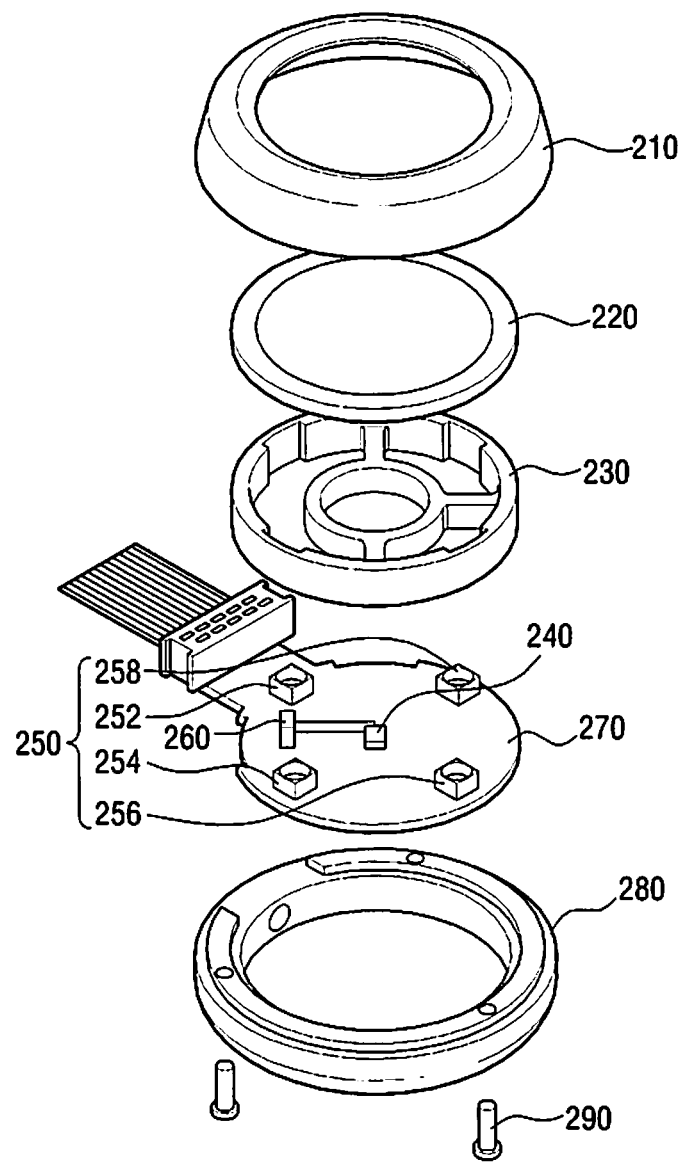
FIG. 2 illustrates a perspective view of a proximity sensor according to an embodiment of the invention.

FIG. 2 illustrates a perspective view of the proximity sensor according to an embodiment of the invention.

As shown in FIG. 2, the proximity sensor 135 includes a package upper part 210, a cover 220, a blocker 230, a photodetector 240, light emitters 250, a compensator 260, a Printed Circuit Board (PCB) 270, a package lower part 280, and screws 290. The light emitters 250 include a first light emitter 252, a second light emitter 254, a third light emitter 256, and a fourth light emitter 258.

The proximity sensor 135 forms its upper part by assembling the package upper part 210, the cover 220, and the blocker 230. The proximity sensor 135 accommodates the PCB 270 on which the photodetector 240, the light emitters 250, and the compensator 260 are mounted. The proximity sensor 135 is formed by coupling the package upper part 210 and the package lower part 280 with the screws 290.

Figure 3:
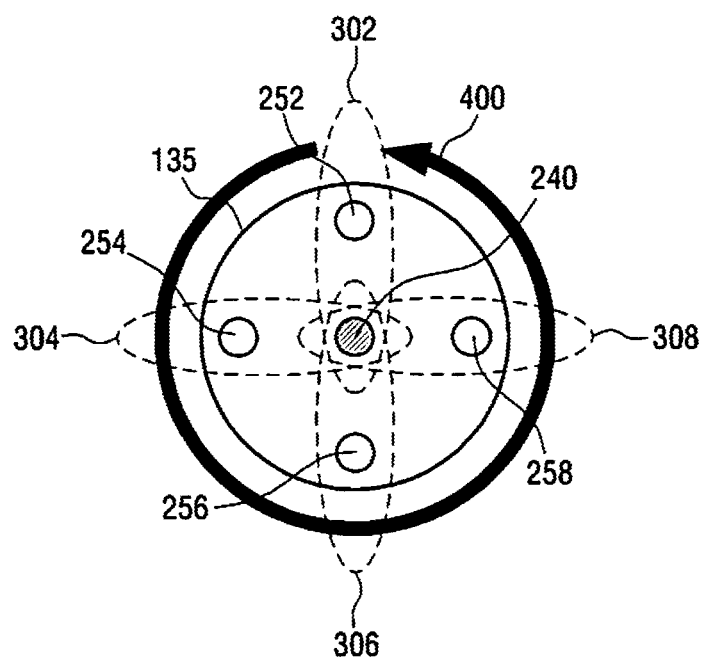
FIG. 3 illustrates an external shape and sensing regions of the proximity sensor according to an embodiment of the invention.

FIG. 3 illustrates an external shape and sensing regions of the proximity sensor 135 according to an embodiment of the invention. In the proximity sensor 135, the photodetector 240 is disposed in the center, the first light emitter 252 is disposed above the photodetector 240, the second light emitter 254 is disposed on the left side, the third light emitter 256 is disposed below the photodetector 240, and the fourth light emitter 258 is disposed on the right side as shown in FIG. 3.

The proximity sensor 135 senses whether the subject is close to a first region 302 by detecting the light reflection from the first light emitter 252. In more detail, when the subject is placed in the first region 302, the light emitted from the first light emitter 252 is reflected by the subject and detected by the photodetector 240. The proximity sensor 135 can locate the subject in the first region 302 by noticing the light detected by the photodetector 240 at the flickering of the first light emitter 252.

Likewise, the proximity sensor 135 senses whether the subject is close to a second region 304 by detecting the light reflection from the second light emitter 254. The proximity sensor 135 senses whether the subject is close to a third region 306 by detecting the light reflection from the third light emitter 256. The proximity sensor 135 senses whether the subject is close to a fourth region 308 by detecting the light reflection from the fourth light emitter 258.

In other words, the proximity sensor 135 detects whether the subject is close to the upward direction using the first light emitter 252, whether the subject is close to the leftward direction using the second light emitter 254, whether the subject is close to the downward direction using the third light emitter 256, and whether the subject is close to the rightward direction using the fourth light emitter 258. Also, the proximity sensor 135 senses the vertical direction (y-axis direction) movement of the subject using the first light emitter 252 and the third light emitter 256, and the horizontal direction (x-axis direction) movement of the subject using the second light emitter 254 and the fourth light emitter 258.

The proximity sensor 135 switches on and off the first light emitter 252, the second light emitter 254, the third light emitter 256, and the fourth light emitter 258 according to the preset loop 400, which indicates the flickering order of the light emitters. The preset loop 400 of FIG. 3 is the order of the first light emitter 252, the second light emitter 254, the third light emitter 256, and the fourth light emitter 258. Hence, when all of the light emitters 252 through 258 operate, the loop 400 proceeds by switching on and off the first light emitter 252 once, the second light emitter 254 once, the third light emitter 256 once, and the fourth light emitter 258 once in this order. As such, according to the order of the preset loop 400, the proximity sensor 135 switches on and off the plurality of the light emitters.

When the photodetector 240 detects the light at the flickering of any one of the first light emitter 252 through the fourth light emitter 258, the proximity sensor 135 locates the subject in the sensing region of the corresponding light emitter.

The control unit 140 can control the repetition speed of the preset loop 400. That is, the control unit 140 can control the flickering time period from the first light emitter 252 to the fourth light emitter 258. When the proximity sensor 135 recognizes the proximity of the subject, the control unit 140 controls to accelerate the repetition speed of the preset loop faster than the non-recognition of the proximity of the subject. When the proximity of the subject is not recognized, the control unit 140 controls to retard the repetition speed of the preset loop of the proximity sensor 135. Upon recognizing the proximity of the subject, the control unit 140 controls to quicken the repetition speed of the preset loop of the proximity sensor 135. By regulating the repetition speed of the loop, the control unit 140 can decrease unnecessary loop repetitions of the proximity sensor 135 and thus reduce the power consumption.

As such, by use of the first light emitter 252 through the fourth light emitter 258, the proximity sensor 135 can sense the proximity and the motion direction of the subject. In addition, by operating only some of the first light emitter 252 through the fourth light emitter 258 of the proximity sensor 135, the control unit 140 may detect only a particular direction motion of the subject, which will be explained by referring to FIGS. 4A and 4B.

Figure 4A:
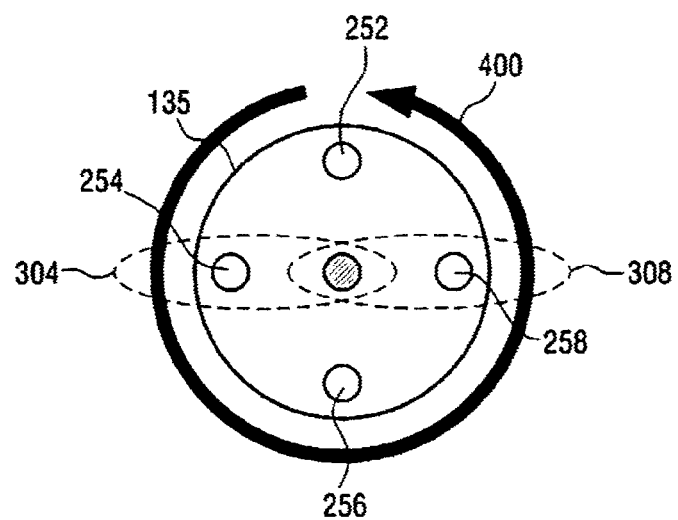
FIG. 4A illustrates the proximity sensor which senses a proximity motion of a horizontal direction according to an embodiment of the invention.

FIG. 4A illustrates the proximity sensor 135, which senses the horizontal proximity motion of the subject according to an embodiment of the invention. In FIG. 4A, the first light emitter 252 and the third light emitter 256 are deactivated (i.e., do not flicker) and the second light emitter 254 and the fourth light emitter 258 are activated (i.e., flicker).

Thus, the proximity sensor 135 can sense whether the subject is in the second sensing region 304 and the fourth sensing region 308, and the horizontal motion of the subject.

The control unit 140 switches on and off the second light emitter 254 and the fourth light emitter 258 according to the order of the preset loop 400. That is, the control unit 140 defines the process of switching on and off the second light emitter 254 once and then the fourth light emitter 258 once, as one loop 400. The control unit 140 then controls the proximity sensor 135 to repeatedly switch on and off the second light emitter 254 and the fourth light emitter 258 according to the defined loop 400.

When the photodetector 240 detects the light at the flickering of the second light emitter 254, the control unit 140 recognizes the subject located on the left side of the proximity sensor 135. When the photodetector 240 detects the light at the flickering of the fourth light emitter 258, the control unit 140 recognizes the subject located on the right side of the proximity sensor 135. When the photodetector 240 detects the light at the flickering of the second light emitter 254 and then the light at the flickering of the fourth light emitter 258, the control unit 140 recognizes that the subject is moving from the left side to the right side of the sensor 135. When the photodetector 240 detects the light at the flickering of the fourth light emitter 258 and then the light at the flickering of the second light emitter 254, the control unit 140 recognizes that the subject is moving from the right side to the left side of the sensor 135.

By operating only the second light emitter 254 and the fourth light emitter 258 as stated above, the control unit 140 can control the proximity sensor 135 to detect only the horizontal movement of the subject. Thus, even when the user inputs a motion askew from horizontal, such as a diagonal movement, the proximity sensor 135 recognizes this motion as the horizontal movement. Hence, when the user requires only the horizontal direction input and does not input the horizontal motion precisely, the user inputs the horizontal direction command without error.

Figure 4B:
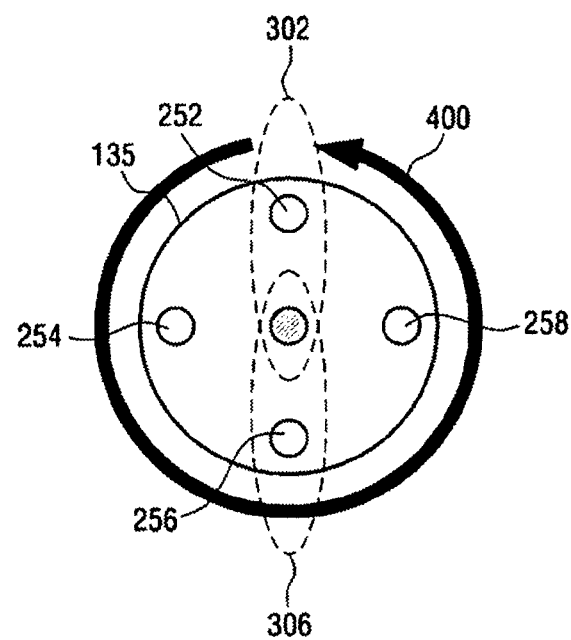
FIG. 4B illustrates the proximity sensor which senses a proximity motion of a vertical direction according to an embodiment of the invention.

FIG. 4B illustrates the proximity sensor 135 which senses the vertical proximity motion according to an embodiment of the invention. In FIG. 4B, the second light emitter 254 and the fourth light emitter 258 are deactivated (i.e., do not flicker) and the first light emitter 252 and the third light emitter 256 are activated (i.e., flicker).

Thus, the proximity sensor 135 can sense whether the subject is in the first sensing region 302 and the third sensing region 306, and the vertical motion of the subject.

The control unit 140 switches on and off the first light emitter 252 and the third light emitter 256 according to the order of the preset loop 400. That is, the control unit 140 defines the process of switching on and off the first light emitter 252 once and then the third light emitter 256 once, as one loop 400. The control unit 140 controls the proximity sensor 135 to repeatedly switch on and off the first light emitter 252 and the third light emitter 256 according to the defined loop 400.

When the photodetector 240 detects the light at the flickering of the first light emitter 252, the control unit 140 recognizes the subject located above the proximity sensor 135. When the photodetector 240 detects the light at the flickering of the third light emitter 256, the control unit 140 recognizes the subject located below the proximity sensor 135. When the photodetector 240 detects the light at the flickering of the first light emitter 252 and then the light at the flickering of the third light emitter 256, the control unit 140 recognizes that the subject is moving from the top end to the bottom end of the sensor 135. When the photodetector 240 detects the light at the flickering of the third light emitter 256 and then the light at the flickering of the first light emitter 252, the control unit 140 recognizes that the subject is moving from the bottom end to the top end of the sensor 135.

By operating only the first light emitter 252 and the third light emitter 256 as stated above, the control unit 140 can control the proximity sensor 135 to detect only the vertical motion of the subject. Thus, even when the user inputs a motion askew from a vertical movement, such as a diagonal movement, the proximity sensor 135 recognizes the motion as the vertical movement. Hence, when the user requires only the vertical direction input and does not input the vertical motion precisely, the user inputs the vertical direction command without error.

Figure 5A:
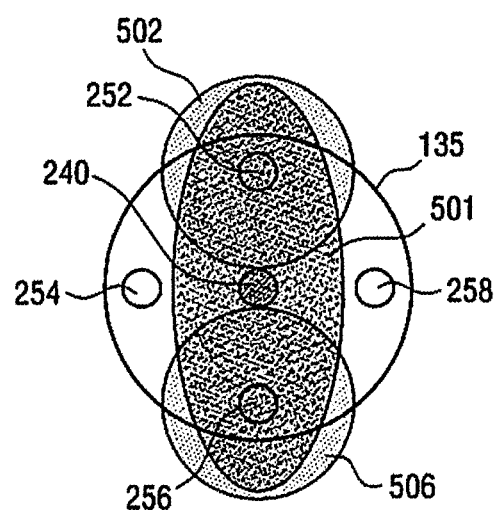
FIG. 5A illustrates light diffusion regions and a light detection region of the proximity sensor when the proximity sensor detects the vertical proximity motion according to an embodiment of the invention.

FIG. 5A illustrates light diffusion regions 502 and 506 and a light detection region 501 of the proximity sensor 135 when the proximity sensor 135 senses the vertical proximity motion of the subject according to an embodiment of the invention.

In FIG. 5A, the second light emitter 254 and the fourth light emitter 258 are deactivated (i.e., do not flicker) and the first light emitter 252 and the third light emitter 256 are activated (i.e., flicker).

FIG. 5A illustrates the light detection region 501 where the photodetector 240 can detect the light. The light detection region 501 ranges over the vertical direction. In addition, FIG. 5A illustrates the first light diffusion region 502 of the first light emitter 252 and the third light diffusion region 506 of the third light emitter 256.

As the photodetector 240 detects the light from the first light emitter 252 and the third light emitter 256, the proximity sensor 135 can sense the vertical motion of the subject.

Figure 5B:
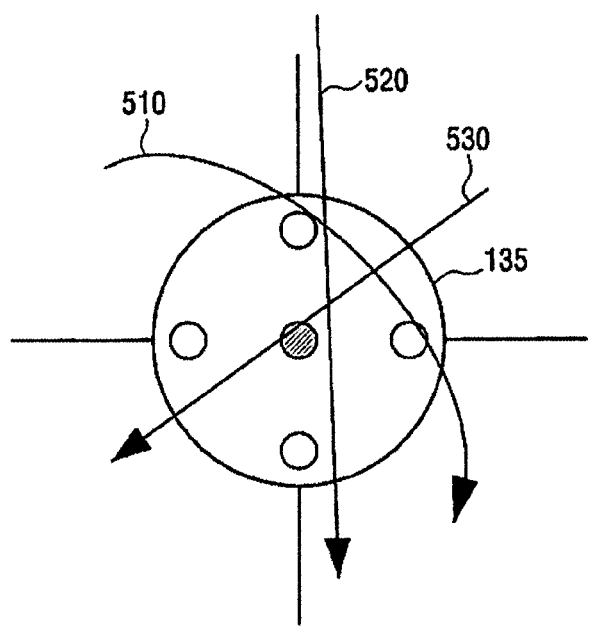
FIG. 5B illustrates subject motions from top to bottom according to an embodiment of the invention.

FIG. 5B illustrates subject motions from top end to bottom end of the sensor 135 according to an embodiment of the invention. In FIG. 5B, a first vertical motion 510, a second vertical motion 520, and a third vertical motion 530 are depicted.

All of the first vertical motion 510, the second vertical motion 520, and the third vertical motion 530 of FIG. 5B are the user's motions to input the motion from top end to bottom end of the sensor 135. It is evident that the second vertical motion 520 is the motion from the top end to bottom end of the sensor 135. However, it is unclear whether the first vertical motion 510 and the third vertical motion 530, respectively, are from the top end to the bottom end or from the left side to the right side of the sensor 135.

When the proximity sensor 135 senses every direction, it is possible to recognize the first vertical motion 510 as the motion from the left side to the right side and the third vertical motion 530 as the motion from the right side to the left side of the sensor 135.

However, as the control unit 140 controls to operate only the first light emitter 252 and the third light emitter 256 as shown in FIG. 5A, the proximity sensor 135 can sense all of the first vertical motion 510 and the third vertical motion 530 as the motions from the top end to the bottom end of the sensor 135 without error.

Figure 6A:
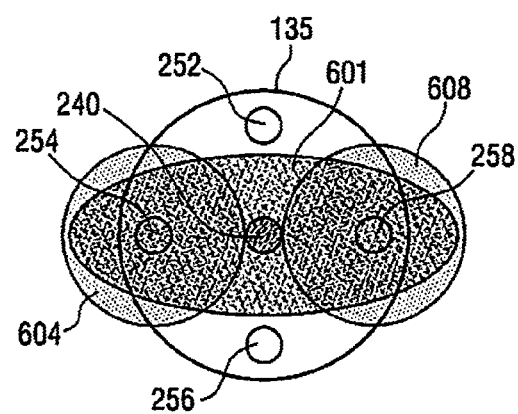
FIG. 6A illustrates light diffusion regions and a light detection region of the proximity sensor when the proximity sensor detects the horizontal proximity motion according to an embodiment of the invention.

FIG. 6A depicts light diffusion regions 604 and 608 and a light detection region 601 of the proximity sensor 135 when the proximity sensor 135 detects the horizontal proximity motion according to an embodiment of the invention.

In FIG. 6A, the first light emitter 252 and the third light emitter 256 are deactivated (i.e., do not flicker) and the second light emitter 254 and the fourth light emitter 258 are activated (i.e., flicker).

FIG. 6A depicts the light detection region 601 where the photodetector 204 can detect the light. The light detection region 601 ranges over the horizontal direction. In addition, FIG. 6A depicts the second light diffusion region 604 of the second light emitter 254 and the fourth light diffusion region 608 of the fourth light emitter 258.

As the photodetector 240 detects the lights from the second light emitter 254 and the fourth light emitter 258, the proximity sensor 135 can sense the horizontal motion of the subject.

Figure 6B:
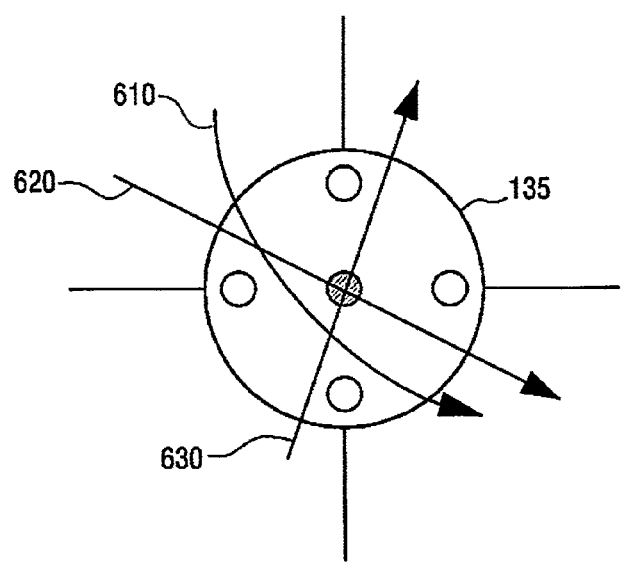
FIG. 6B illustrates subject motions from left to right according to an embodiment of the invention.

FIG. 6B illustrates subject motions from the left side to the right side of the sensor 135 according to an embodiment of the invention. In FIG. 6B, a first horizontal motion 610, a second horizontal motion 620, and a third horizontal motion 630 are shown.

All of the first horizontal motion 610, the second horizontal motion 620, and the third horizontal motion 630 of FIG. 6B are the user's motions to input the motions from the left side to the right side of the sensor 135. It is relatively evident that the second horizontal motion 620 is the motion from the left side to the right side. However, it is unclear whether the first horizontal motion 610 and the third horizontal motion 630, respectively, are from the top end to the bottom end or from the left side to the right side of the sensor 135.

When the proximity sensor 135 senses every direction, it is possible to recognize the first horizontal motion 610 as the motion from the top end to the bottom end and the third horizontal motion 630 as the motion from the bottom end to the top end of the sensor 135.

However, as the control unit 140 controls to operate only the second light emitter 254 and the fourth light emitter 258 as shown in FIG. 6A, the proximity sensor 135 can sense all of the first horizontal motion 610 and the third horizontal motion 630 as the motions from the left side to the right side of the sensor 135 without error.

When the scrolling direction displayed in the current screen is vertical, the electronic apparatus 100 controls the proximity sensor 135 to sense only the vertical motions by controlling to switch on and off the first light emitter 252 and the third light emitter 256 respectively, which will now be explained by referring to FIGS. 7A through 7E.

FIGS. 7A through 7E illustrate a scrolling process using the proximity sensor 135 when a menu allowing the vertical scrolling is displayed according to an embodiment of the invention.

Figure 7A:
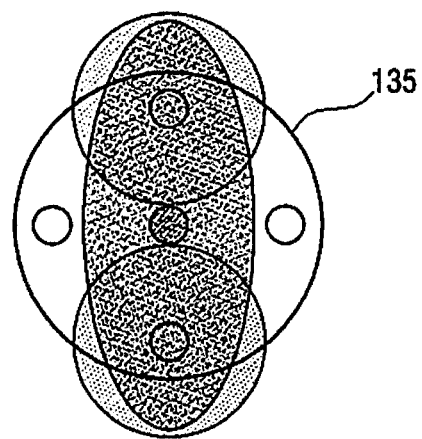
FIGS. 7A through 7E illustrate a scrolling process using the proximity sensor when a menu allowing the vertical scrolling is displayed according to an embodiment of the invention.

FIG. 7A illustrates the proximity sensor 135 which senses the vertical proximity motion of the subject. In FIG. 7A, the second light emitter 254 and the fourth light emitter 258 are deactivated (i.e., do not flicker) and the first light emitter 252 and the third light emitter 256 are activated (i.e., flicker).

Figure 7B:
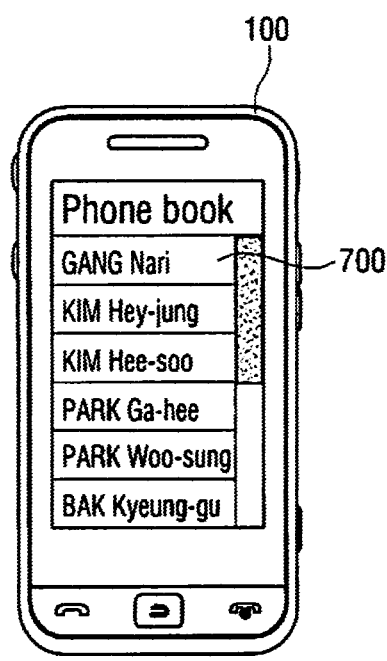

FIG. 7B depicts the electronic apparatus 100 displaying the menu 700 with the vertical scrolling in the screen. When the menu 700 with the vertical scrolling is displayed as shown in FIG. 7B, the proximity sensor 135 can sense only the vertical motion as shown in FIG. 7A.

Figure 7C:
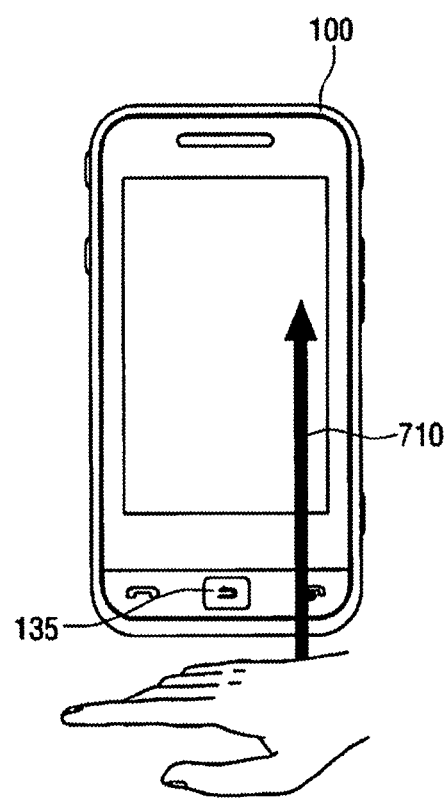
Figure 7D:
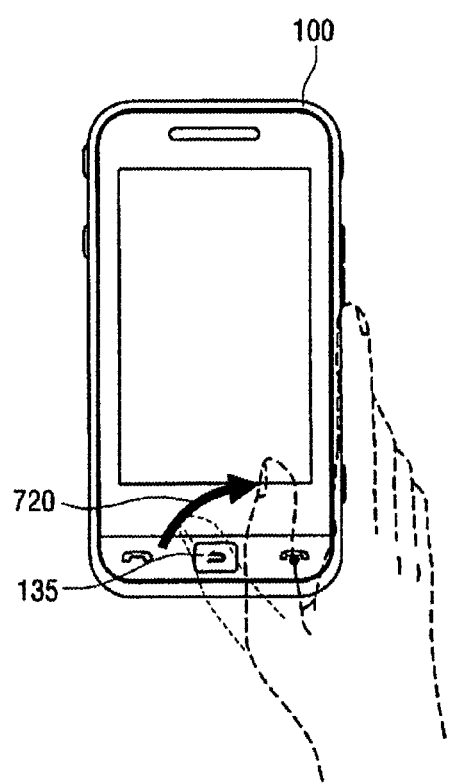
Figure 7E:
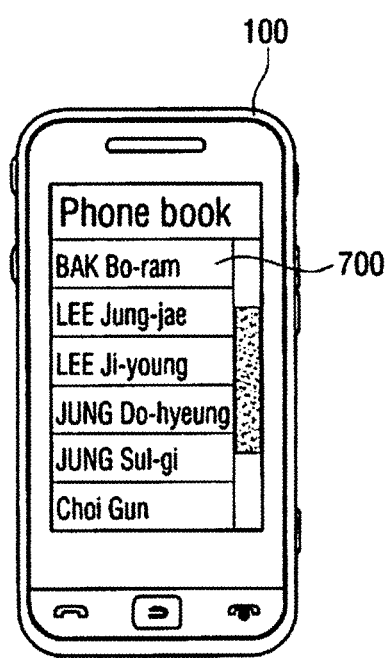

Even when the user inputs the motion 710 from the bottom end to the top end of the sensor 135 as shown in FIG. 7C or the diagonal motion 720 from the bottom end to the top end of the sensor 135 as shown in FIG. 7D, the proximity sensor 135 senses the motion from the bottom end to the top end without error. As a result, the electronic apparatus 100 scrolls the menu 700 upward and thus displays the screen as shown in FIG. 7E.

Figure 8A:
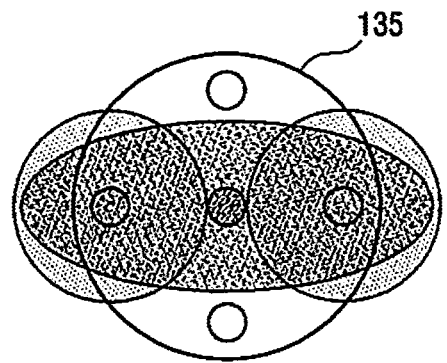
FIGS. 8A, 8B, and 8C illustrate a scrolling process using the proximity sensor when a menu allowing the horizontal scrolling is displayed according to an embodiment of the invention.
Figure 8B:
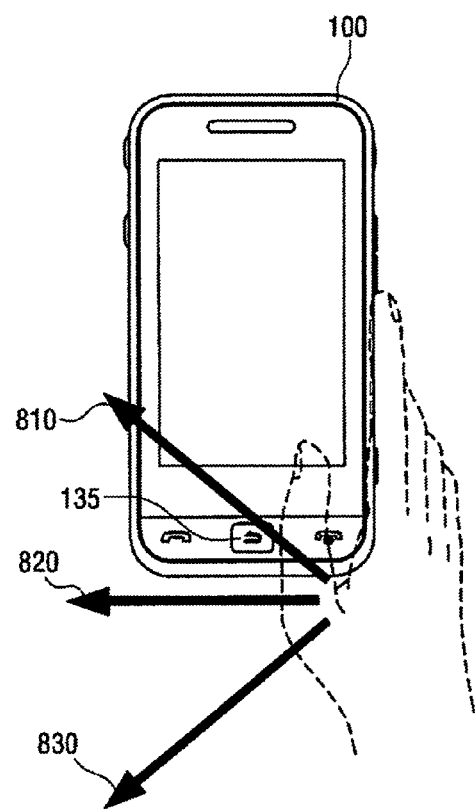
Figure 8C:
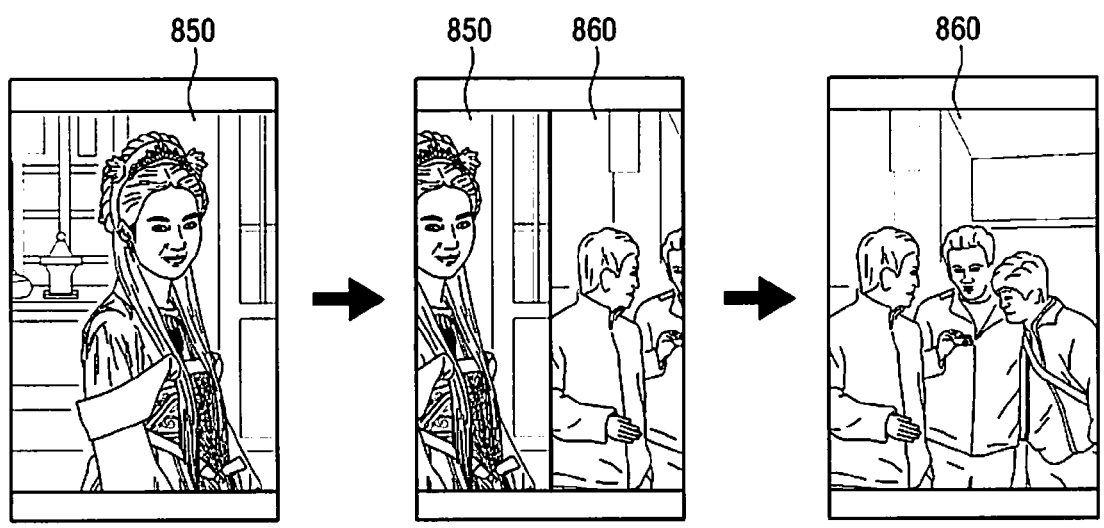

FIGS. 8A, 8B, and 8C illustrate the scrolling process using the proximity sensor 135 when a menu allowing the horizontal scrolling is displayed according to an embodiment of the invention.

FIG. 8A illustrates the proximity sensor 135 which senses the horizontal proximity motion of the subject. In FIG. 8A, the first light emitter 252 and the third light emitter 256 are deactivated (i.e., do not flicker) and the second light emitter 254 and the fourth light emitter 258 are activated (i.e., flicker).

When a picture with the horizontal scrolling is displayed in the screen, the proximity sensor 135 senses only the horizontal motions as shown in FIG. 8A.

Even when the user inputs the motion 820 from the right side to the left side of the sensor 135 or the diagonal motions 810 and 830 from the right side to the left side as shown in FIG. 8B, the proximity sensor 135 senses the motions from the right to the left without error.

Consequently, when the proximity sensor 135 senses the motion from the right to the left as shown in FIG. 8B, the electronic apparatus 100 displays a second picture 860 following the first picture 850, in the screen as illustrated in FIG. 8C.

Although the four light emitters 250 are illustrated in the figures herein, the number of the light emitters is not limited. For example, the proximity sensor 135 can include eight light emitters 910 through 980 as shown in FIG. 9.

Figure 9:
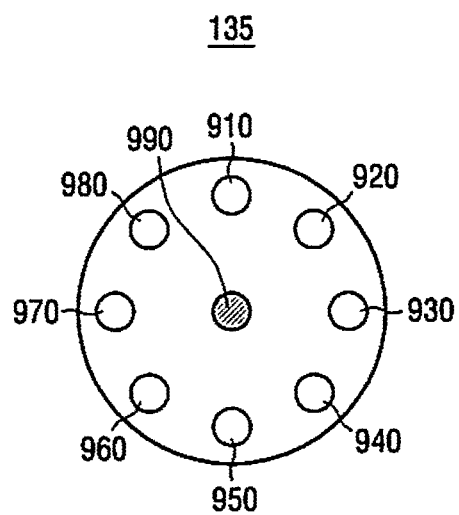
FIG. 9 illustrates a proximity sensor including eight light emitters according to an embodiment of the invention.

FIG. 9 illustrates the proximity sensor 135 including eight light emitters according to an embodiment of the invention. In the proximity sensor 135, the eight light emitters 910 through 980 can be disposed based on the photodetector 990, of which four are placed in the upper, lower, left and right sides of the sensor and four are placed in the diagonal directions of the sensor 135, as shown in FIG. 9.

While a single proximity sensor 135 is described above, the number of the proximity sensors 135 is not limited. For instance, four proximity sensors 135 can be disposed in the upper, lower, left and right sides of the electronic apparatus 100 as shown in FIG. 10.

Figure 10:
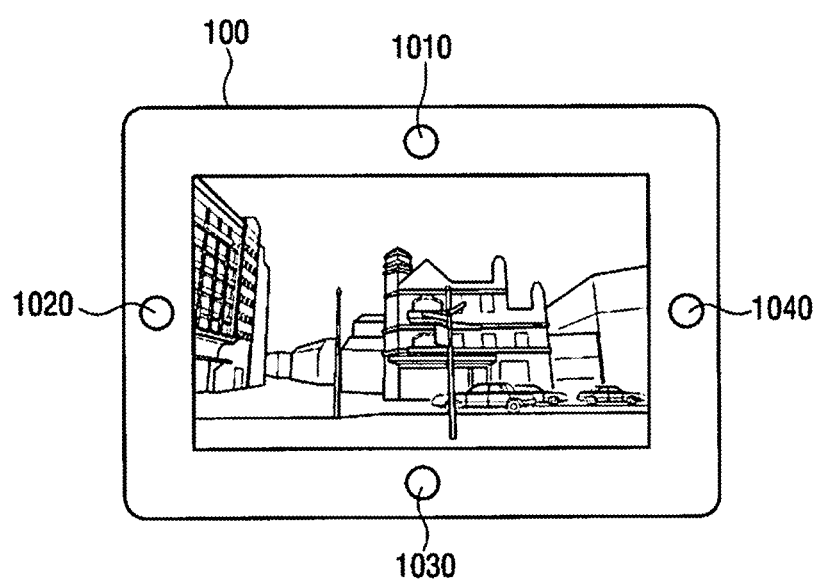
FIG. 10 illustrates an electronic apparatus including four proximity sensors disposed in upper, lower, left, and right sides according to an embodiment of the invention.

FIG. 10 illustrates an electronic apparatus including four proximity sensors 1010 through 1040 disposed in upper, lower, left, and right sides of the electronic apparatus 100 according to an embodiment of the invention. In FIG. 10, the first proximity sensor 1010 and the third proximity sensor 1030 detect the vertical motions of the subject, and the second proximity sensor 1020 and the fourth proximity sensor 1040 detect the horizontal motions of the subject.

While the preset loop 400 for the flickering order is, but is not limited to, the order of the first light emitter 252, the second light emitter 254, the third light emitter 256, and the fourth light emitter 258 by way of example, different orders can be applied. For example, the preset loop 400 can follow the order of the first light emitter 252, the third light emitter 256, the second light emitter 254, and the fourth light emitter 258.

Meanwhile, the electronic apparatus 100 can employ any apparatus including the proximity sensor. For example, the electronic apparatus 100 can be a mobile phone, a Television (TV), an MP3 player, a Point to Multimedia Point (PMP), a Personal Data Assistant (PDA), a notebook computer, and a computer including the proximity sensor.

As set forth above, the present electronic apparatus controls to detect a particular direction motion in the directions detectable by the proximity sensor, which senses the proximity and the motion direction of the subject. Therefore, the user can utilize the proximity sensor with decreased recognition error and a high recognition rate as the user interface of the electronic apparatus.

Although embodiments of the present invention have been shown and described, it will be appreciated by those skilled in the art that changes may be made in these embodiments without departing from the principles and spirit of the invention, the scope of which is defined in the claims and their equivalents.

What is claimed is:

1. An electronic apparatus comprising:
   a proximity sensor configured to sense a proximity and motion direction of a subject, the proximity sensor comprising:
   a plurality of light emitters; and
   a photodetector; and
   a control unit configured to select a particular direction of motion for the proximity sensor to sense by selecting a first light emitter and a second light emitter located opposite to the first light emitter, lighting the selected first and second light emitters, and using the photodetector to detect motion of the subject in the particular direction as lit by the selected first and second light emitters.

2. The electronic apparatus of claim 1, wherein the control unit selects the particular motion direction according to a current function.

3. The electronic apparatus of claim 1, wherein the control unit selects the particular motion direction according to an input of a user.

4. The electronic apparatus of claim 1, wherein the proximity sensor senses motions of a first-axis direction and a second-axis direction, and
   the control unit is configured to select one of the first-axis direction and the second-axis direction of motion for the proximity sensor to sense.

5. The electronic apparatus of claim 4, wherein the first-axis direction and the second-axis direction are an x-axis direction and a y-axis direction, respectively.

6. The electronic apparatus of claim 1, wherein lighting the selected one or more light emitters comprises making the selected first and second light emitters individually flicker according to a preset sequence.

7. The electronic apparatus of claim 6, wherein the particular direction is an axial direction formed by the flickering light emitters.

8. The electronic apparatus of claim 6, wherein, when the proximity sensor senses the proximity of the subject, the control unit is configured to accelerate a repetition speed of the preset sequence quicker than when the proximity of the subject is not sensed.

9. A mobile terminal capable of detecting motion as user input, comprising:
   a total plurality of light emitters disposed on the mobile terminal;
   a display screen disposed on the mobile terminal;
   a control unit configured to determine that an application presently using the display screen may receive user input indicating one of two possible choices, to select a selected plurality, of the total plurality of light emitters, to be lit in a preset sequence so that one of two opposite directions of motion of an object within range of a photodetector disposed on the mobile terminal may be detected, and to provide a detected one of the two opposite directions of motion as user input to the application indicating a selection of one of the two possible choices; and the photodetector configured to detect one of the two opposite directions of motion of the object from reflections from the object of the preset sequence of lighting of the selected plurality of light emitters.

10. The mobile terminal of claim 9, wherein the total plurality of light emitters comprise a first light emitter disposed in an upward direction, a second light emitter disposed in a leftward direction, a third light emitter disposed in a downward direction, and a fourth light emitter disposed in a rightward direction of a proximity sensor based on the photodetector.

11. The mobile terminal of claim 9, wherein the particular direction of motion to sense is up and down and the control unit selects the first light emitter and the third light emitter to flicker in a preset sequence.

12. The mobile terminal of claim 11, wherein a scrolling direction of a currently displayed screen of the application is vertical and the currently displayed screen is scrolled in a direction of motion detected by the photodetector from reflections from the subject of the preset sequence of flickering of the first light emitter and the third light emitter.

13. The mobile terminal of claim 10, wherein the particular direction of motion to sense is left and right and the control unit selects the second light emitter and the fourth light emitter to flicker in a preset sequence.

14. The mobile terminal of claim 13, wherein a scrolling direction of a currently displayed screen of the application is horizontal and the currently displayed screen is scrolled in a direction of motion detected by the photodetector from reflections from the subject of the preset sequence of flickering of the second light emitter and the fourth light emitter.

15. The mobile terminal of claim 9, wherein the object is at least one of a user of the mobile terminal and an object being manipulated by the user of the mobile terminal.

16. The mobile terminal of claim 9, wherein the control unit is further configured to select a loop plurality from the total plurality of light emitters to be lit in a sequence forming a loop around the photodetector, and the photodetector is further configured to detect a proximal location of an object within range of the photodetector from reflections from the object during the loop sequence of lighting from the loop plurality of light emitters.

17. The mobile terminal of claim 9, wherein the selected plurality of light emitters to be lit in the preset sequence are those light emitters disposed on the mobile terminal in the two opposite directions of which one is to be detected by the photodetector.

18. The mobile terminal of claim 17, wherein the two opposite directions are right and left relative to the display screen, and the selected plurality of light emitters to light in the preset sequence are disposed right and left relative to the photodetector, parallel to right and left relative to the display screen.

19. The mobile terminal of claim 9, wherein the two possible choices correspond to directions for scrolling material on the display screen.

20. A method for a mobile terminal to detect motion as user input, comprising:
 selecting a select plurality of light emitters from a total plurality of light emitters disposed on the mobile terminal to light in a preset sequence, the selecting corresponding to possible user input to an application presently displayed on the mobile terminal, the possible user input being an indication of one of two opposite directions relative to a screen of the mobile terminal;
 lighting the selected plurality of light emitters in the preset sequence;
 detecting any component of motion of an object adjacent to the screen of the mobile terminal in one of the two opposite directions from timing and direction of reflections from the object in relation to the preset sequence of lighting from the selected plurality of light emitters; and
 providing the detected direction as user input to the application.

\* \* \* \* \*